United States Patent
Liddell et al.

(10) Patent No.: US 9,582,619 B1
(45) Date of Patent: Feb. 28, 2017

(54) SIMULATION OF A CIRCUIT DESIGN BLOCK USING PATTERN MATCHING

(71) Applicant: Xilinx, Inc., San Jose, CA (US)

(72) Inventors: David K. Liddell, Longmont, CO (US); Feng Cai, Longmont, CO (US); Saikat Bandyopadhyay, Kolkata (IN)

(73) Assignee: XILINX, INC., San Jose, CA (US)

( * ) Notice: Subject to any disclaimer, the term of this patent is extended or adjusted under 35 U.S.C. 154(b) by 705 days.

(21) Appl. No.: 14/058,505

(22) Filed: Oct. 21, 2013

(51) Int. Cl.
*G06F 17/50* (2006.01)

(52) U.S. Cl.
CPC ...... *G06F 17/5022* (2013.01); *G06F 17/5045* (2013.01)

(58) Field of Classification Search
CPC ............ G06F 17/5022; G06F 17/5045; G06F 17/5031; G11C 29/1201
See application file for complete search history.

(56) References Cited

U.S. PATENT DOCUMENTS

| | | | | |
|---|---|---|---|---|
| 6,874,134 | B1* | 3/2005 | Collin | G06F 17/5045 716/103 |
| 2003/0208727 | A1* | 11/2003 | Mortensen | G06F 17/5031 716/108 |
| 2004/0190331 | A1* | 9/2004 | Ross | G11C 29/1201 365/154 |
| 2009/0217213 | A1* | 8/2009 | Meserve | G06F 17/5045 716/100 |
| 2009/0307640 | A1* | 12/2009 | Chapman | G06F 17/5045 716/136 |
| 2010/0192115 | A1* | 7/2010 | Yang | G06F 17/5022 716/104 |
| 2011/0061033 | A1* | 3/2011 | Nakayama | G06F 17/5022 716/104 |
| 2013/0054218 | A1* | 2/2013 | Ashraf | G06F 17/5022 703/14 |

* cited by examiner

*Primary Examiner* — Kandasamy Thangavelu
(74) *Attorney, Agent, or Firm* — LeRoy D. Maunu

(57) ABSTRACT

An approach for simulating a block of a circuit design includes using a row-matching table and a port state vector. The row-matching table includes a plurality of rows, and each row includes encoded input match patterns corresponding to a plurality of input ports of the block and an associated output value. The port state vector includes input state codes associated with the input ports. In response to an update of an input signal value at one of the input ports during simulation, the input state code associated with the one input port is updated according to the updated input signal value. A bit-to-bit pattern match is performed for each bit in the port state vector to a corresponding bit in the encoded input match patterns in one or more rows of the row-matching table. The associated output value of a matching row is selected as a new output value.

20 Claims, 5 Drawing Sheets

FIG. 3

| byte | 0 | 1 | 2 | ... | n | 0 to 3 bytes |
|---|---|---|---|---|---|---|
| state | output 1 | input 2 | input 3 | ... | input *n* | fill value(s) |

| byte | 0 | 1 | 2 | ... | n | 0 to 3 bytes | 3 empty bytes | 1 byte |
|---|---|---|---|---|---|---|---|---|
| match pattern | output 1 | input 2 | input 3 | ... | input *n* | match any value | | new output |

| bit | 7 | 6 | 5 | 4 | 3 | 2 | 1 | 0 |
|---|---|---|---|---|---|---|---|---|
| | - | \multicolumn{3}{c|}{old value} | level | \multicolumn{3}{c|}{new value} |
| | | 0 | 1 | X | | 0 | 1 | X |

# SIMULATION OF A CIRCUIT DESIGN BLOCK USING PATTERN MATCHING

TECHNICAL FIELD

The disclosure generally relates to the simulation of circuit designs.

BACKGROUND

Some hardware description languages (HDL), for example Verilog, provide a way of expressing design unit functionality with a single process of a form similar to a logic truth table. The columns of the table represent one or more single-bit input ports plus one single-bit output port, and the rows represent combinations of input port values and value changes (edges) plus the value to place on the output port. Such a design unit is called a User Defined Primitive (UDP), and the truth table-like specification is called a UDP state table. As with a truth table, the inputs of a UDP are compared against the rows of the state table, and whichever row matches the inputs determines the output value.

In an attempt to improve performance in simulating a UDP, prior approaches specified transforming the UDP state table such that every possible combination of different input values was expanded into its own table entry. Computing the output value of the UDP then involved applying a polynomial formula to the input values to calculate a table index and looking up the output value at the indexed location in the table. Although calculating the index value is a constant time operation, the constant value is high, making the computation expensive. Also, a value change history of a net may be used to detect an edge on the signal at the input port of a UDP. Maintaining the value change history for the input signals of each UDP slows the simulation. Further impacting a desired level of efficiency is the size of the UDP state table, which grows exponentially with the number of UDP inputs. The memory devoted to storing the large UDP state table might otherwise be used to store other parts of the simulation model.

SUMMARY

A method of simulating a block of a circuit design having a plurality of input ports and an output port is provided in one implementation. A row-matching table and a port state vector are stored in a memory of a computing arrangement. The row-matching table includes a plurality of rows, and each row includes respective encoded input match patterns corresponding to the plurality of input ports and an associated output value. The port state vector includes respective input state codes associated with the plurality of input ports. In response to an update of an input signal value at one of the plurality of input ports during simulation on a programmed processor of the computer arrangement, various operations are performed. The operations include updating the input state code associated with the one of the plurality of input ports according to the updated input signal value. A bit-to-bit pattern match is performed for each bit in the port state vector to a corresponding bit in the encoded input match patterns in one or more rows of the row-matching table. In response to each bit in the port state vector matching the corresponding bit of the encoded input match patterns in one of the rows of the row-matching table, the method selects the associated output value of the one row as a new output value, and outputs the new output value.

In another implementation, a system for simulating a block of a circuit design is provided. The system includes a processor coupled to a memory. The memory is configured with instructions executable by the processor. The instructions, when executed by the processor, cause the processor to perform operations including storing a row-matching table in a memory of a computing arrangement. The row-matching table includes a plurality of rows, and each row includes respective encoded input match patterns corresponding to the plurality of input ports and an associated output value. The processor also stores a port state vector in the memory. The port state vector includes respective input state codes associated with the plurality of input ports. In response to an update of an input signal value at one of the plurality of input ports during simulation, the processor updates the input state code associated with the one of the plurality of input ports according to the updated input signal value. The processor also performs a bit-to-bit pattern match of each bit in the port state vector to a corresponding bit in the encoded input match patterns in one or more rows of the row-matching table. In response to each bit in the port state vector matching the corresponding bit of the encoded input match patterns in one of the rows of the row-matching table, the processor selects the associated output value of the one row as a new output value and outputs the new output value.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings, in which:

FIG. 3 shows the format of the port state vector for a sequential UDP;

FIG. 4 shows the format of a row of a row-matching table for a sequential UDP;

FIG. 5 shows the format of input and output states in the port state vector and the match patterns in the row-matching table;

DETAILED DESCRIPTION

The approaches for simulating User-defined Primitives (UDPs) described herein offer speed improvements and a reduction in memory requirements over prior implementations. In one approach, the states of the input ports of the UDP are encoded in entries in a port state vector. A row-matching table is constructed with rows of match patterns and associated output values. In response to the encoded entries matching a row in the row-matching table, the associated output value is selected as the output of the UDP. The encoding and format of the states of the ports and the match patterns support a fast, bit-by-bit comparison of states in the port state vector to match patterns in the row-matching table. This allows the matching of port states to a row of the row-matching table to be performed with bitwise-AND and equality test instructions.

For a UDP in which the output of the UDP is also used as an input to the UDP (a sequential UDP), the port state vector includes an output state code, and rows in the row-matching table include encoded output match patterns. In addition, each port state and match pattern may include a level bit whose state indicates the absence or presence of an edge for the associated signal. After selecting a new output value for the UDP, and in preparation for the next delta cycle, the level bits of all the match patterns in the row-matching table may be set so that the inputs no longer register as having edges.

Figure 1:
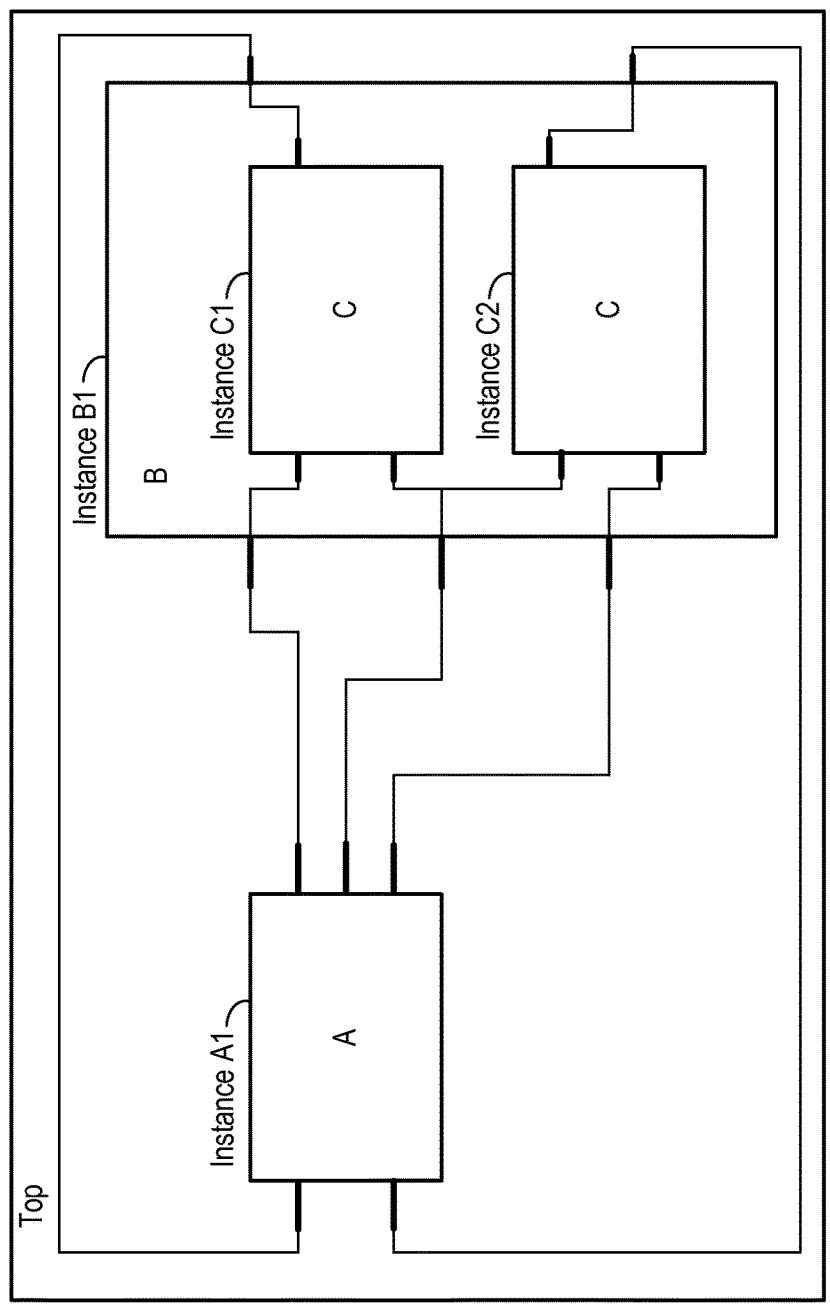
FIG. 1 shows an example of a hierarchical circuit design.

FIG. 1 shows an example of a hierarchical circuit design. Complex digital circuits are typically designed in a hierarchical fashion, with circuit functionality partitioned into design unit blocks, whose input and output ports are then connected together with wires (called nets), as shown in FIG. 1. To facilitate reuse, multiple copies of a particular design unit may be present in the design. Each copy is called an instance. In FIG. 1, Top, A, B, and C are design units, A1 is an instance of design unit A, B1 is an instance of design unit B, and C1 and C2 are instances of design unit C. Thick lines extending from the instances of the design blocks represent ports, and each line or lines connecting an output port to one or more input ports represents a net.

Hardware Description Languages (HDL) such as Verilog provide several different ways to express the time-dependent functionality of a design unit, further dividing the design into units called "processes." Types of processes include primitive parts, procedural program statements, and data flow representation. The primitive parts have intrinsic behavior defined by the HDL itself, and include elements such as AND gates, OR gates, digital switches, buffers, etc. Procedural program statements are similar to those found in software programming languages, such as "for" loops, "if" statements, assignment statements, etc. A data flow representation has the values of output ports described in terms of arithmetic or logical formulae whose variables are the values of the input ports.

As explained above, processes may be specified in a form similar to a logic truth table called a UDP. The columns of the UDP specification represent one or more single-bit input ports plus one single-bit output port, and the rows represent combinations of input port values and value changes (edges) plus the value to place on the output port. As with a truth table, the inputs of a UDP are compared against the rows of the state table, and whichever row matches the inputs determines the output value. Table 1 below shows the UDP state table for an AND gate. The "?" indicates a value of 0, 1, or X (unknown value), while b indicates a value of 0 or 1. If both of the inputs A and B are 1, the output O is 1. If either input is X, the output is X, and otherwise the output is 0.

TABLE 1

| A | B | O | Description |
|---|---|---|---|
| 1 | 1 | 1 | If both A and B are 1, O is 1 |
| x | ? | X | If A is X, then regardless of the value of B, O is X |
| ? | X | X | If B is X, then regardless of the value of A, O is X |
| 0 | b | 0 | If A is 0, then as long as B is not X, O is 0 |
| b | 0 | 0 | If B is 0, then as long as A is not X, O is 0 |

The example in Table 1 produces an output that is dependent on the current values of the inputs with no regard to activity that may have occurred in the past. However, UDP design units can also take into account activity that happened in the past by adding a column representing the latest output value and using the latest output value as a feedback, as shown in Table 2. Table 2 shows the UDP state table for a simple 1-bit counter with enable. Upon a 0-to-1 edge of C, that is, a value change from 0 to 1, Q toggles if E is 1. The Q column indicates the current value of output Q, the Q+ column indicates the new value to place on output Q, an entry of the form (ab) indicates an edge from a previous (or "old") value a to a current (or "new") value b, and an entry of "-" indicates that the output does not change. Single-character entries are called levels and match the current value of a port whether or not the input is an edge. For example, if an input port has an edge (01), a row specifying the level 1 will match the input because 1 is the current value of the port.

TABLE 2

| C | E | Q | Q+ | Description |
|---|---|---|----|---|
| (01) | 1 | 0 | 1 | Upon a 0-to-1 edge of C, if E is 1 and Q was 0, Q becomes 1 |
| (01) | 1 | 1 | 0 | Upon a 0-to-1 edge of C, if E is 1 and Q was 1, Q becomes 0 |
| (01) | 1 | X | — | Upon a 0-to-1 edge of C, if E is 1 and Q was X, Q remains unchanged (X) |
| (01) | X | ? | X | Upon a 0-to-1 edge of C, if E is X, then regardless of the current state of Q, Q becomes X |
| (??) | 0 | ? | — | Upon any edge of C, if E is 0, Q remains unchanged |
| (X1) | 1 | ? | X | Upon an X-to-1 edge of C, if E is 1, Q becomes X |
| (0X) | 1 | ? | X | Upon a 0-to-X edge of C, if E is 1, Q becomes X |
| (1?) | ? | ? | — | Upon a 1-to-0 or 1-to-X edge of C, Q remains unchanged |
| (?0) | ? | ? | — | Upon an X-to-0 or 1-to-0 edge of C, Q remains unchanged |
| ? | (??) | ? | — | If C has no edge, Q remains unchanged |

A UDP that specifies a current output value column is called a sequential UDP, and a UDP that does not specify a current output value column is called a combinational UDP. According to the Verilog language rules, the order of the rows of the table is unimportant. If multiple rows match the set of input values and the current output value is specified, it is an error if the new output values given for each matching row are not identical.

A simulator generally proceeds by looping repeatedly over two main steps. In the first step, the simulator updates the value of the nets of the HDL design. If the value of a net has changed, then for each process in the HDL design for which the updated net is a stimulus, that process is marked to be executed. The process of marking a process to be executed is also referred to as scheduling the process. In the second step, the scheduled processes are executed, and the executing processes produce new values to place on nets.

Each iteration of the loop is called a delta cycle. Delta cycles are relevant to UDP processing in that for a net used as a UDP input port, the fact that the net has an edge must be retained until the next delta cycle. An edge is a change from one value to a distinctly different value.

Before a simulation runs, the HDL source code may be translated into a set of C-language functions of two main types, execute functions and transaction functions. Each process is translated into an execute function, and each net defined in the HDL source is translated into a transaction function. A transaction function takes a new net value, updates the memory storage holding that particular net's value, and schedules dependent processes.

For a UDP, the mechanism for detecting a change in value for a particular net is implemented in the transaction function for that net. The design compiler translates each UDP into an execute function. The execute function for a UDP fetches the current value of the UDP's output port and then invokes the row-matching algorithm function. The output port, row-matching table, and port state vector are passed as parameters to the row-matching algorithm. The execute function updates the output port net of the UDP with the new output value that the row-matching algorithm calculates.

Figure 2:
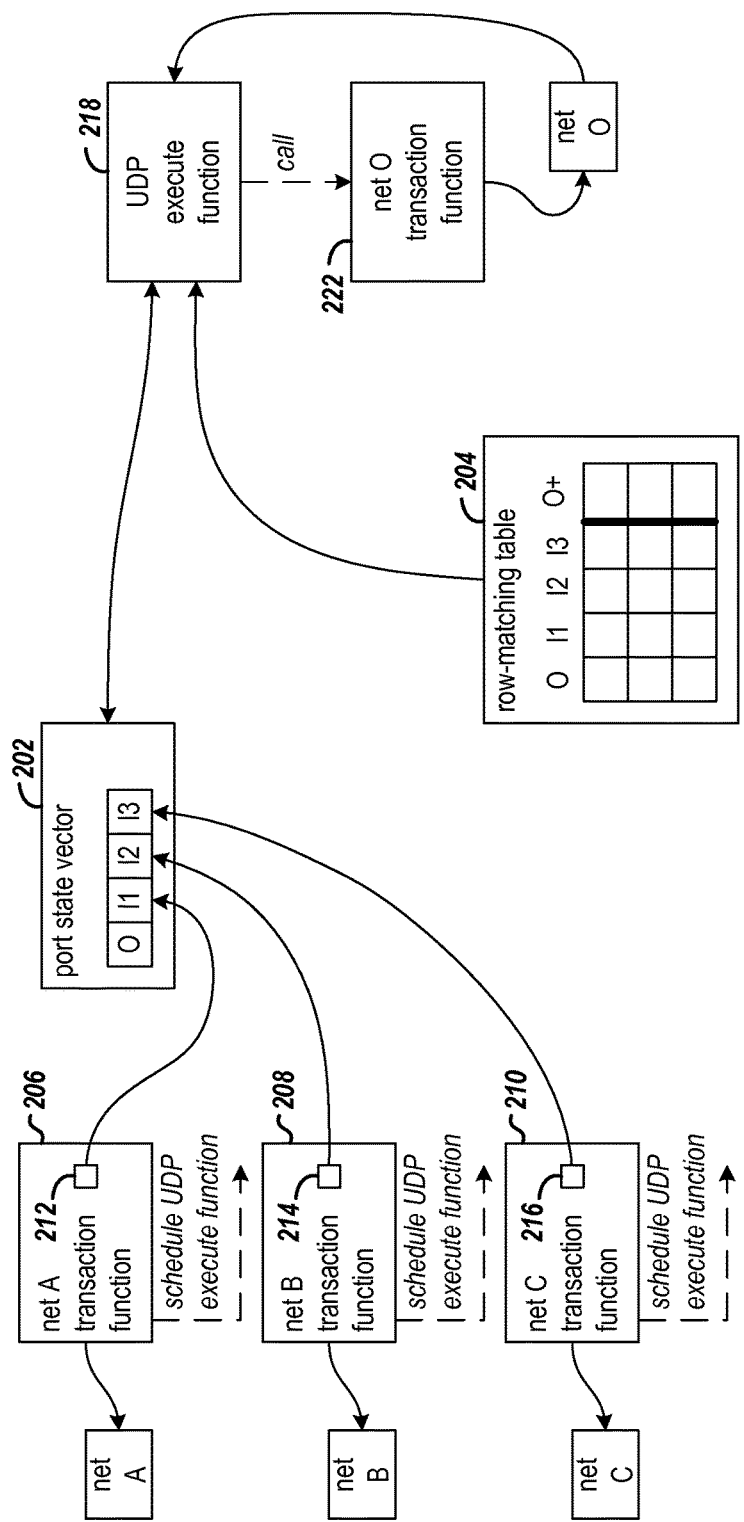
FIG. 2 shows an example of a dataflow in which a port state vector and a row-matching table are used in determining a new output value in response to an updated signal value at an input port of a user-defined primitive.

FIG. 2 shows an example of a dataflow in which a port state vector 202 and a row-matching table 204 are used in determining a new output value in response to an updated signal value at an input port of a user-defined primitive. The port state vector includes respective input state codes associated with input ports of the UDP. In the example, the UDP has three input ports, which are connected to nets A, B, and C, respectively. The port state vector has input state codes I1, I2, and I3, which correspond to the three input ports, respectively, and also correspond to nets A, B, and C, respectively. Since the example is of a sequential UDP, the port state vector also includes output state code O, which corresponds to the output port of the UDP, and which also corresponds to net O.

The row-matching table 204 includes multiple rows, and each row includes respective encoded input match patterns that correspond to the input ports of the UDP. Columns I1, I2, and I3, correspond to the input ports, respectively. Since the example is of a sequential UDP, the rows in the row-matching table also include respective output match patterns, which are in column O. Each row of the row-matching table further includes an associated output value, which is in the column O+.

Although three input nets and one output net are shown in the example, it will be appreciated that other UDPs may have input ports connected to more or fewer input nets, and/or more output ports connected to more output nets, than in the example.

The UDP mechanism activates in response to one or more of the input nets of a UDP instance being updated via a call to the net's transaction function. For example, one or more of transaction functions 206, 208, or 210 may be called in order to update the value of the corresponding input nets A, B, and/or C.

Blocks 212, 214, and 216 within the transaction functions are the respective UDP value change detectors, each of which encodes the net value change and updates the input state code in the corresponding entry in the port state vector 202. The directional lines from the blocks 212, 214, and 216 to the corresponding state codes in the port state vector represent the updating of the table. The called transaction function(s) schedules the UDP execute function 218 to run, then updates the net value (nets A, B, and/or C).

The UDP execute function 218 gets the current value of the output net O from the net attached to the UDP, the port state vector 202, and the row-matching table 204 and then runs the row-matching algorithm. First, the algorithm encodes and stores the output value O in the port state vector 202. Next, with the encoded state value and encoded match patterns, the row-matching algorithm employs bit-to-bit pattern matching, which significantly improves performance. For example, in the bit-to-bit pattern matching, each bit of each state code in the port state vector is matched to a corresponding bit in each match pattern in each row of the row-matching table. The algorithm continues through each row of the row-matching table 204 until a row is found for which all bits match the port state vector 202. Finally, with the new output value O+ from the matching row, the algorithm calls the transaction function 222 for net O in order to update net O.

Each UDP instance has an associated port state vector for storing the current state of the UDP instance's input ports and an associated row-matching table that represents the UDP state table. For sequential UDPs, the associated port state vectors and row-matching tables also include the current value of the output port.

FIG. 3 shows the format of the port state vector 300 for a sequential UDP. Each state code, which corresponds to a port of the UDP, occupies a one-byte slot of the table. Port state vector 300 has the output state code in byte 0 of the table, and state codes for the n inputs in bytes 1 through n. For a combinational UDP, there would not be a state code for the output of the UDP, and the input state codes would occupy bytes 0 through n−1.

For ease of processing in the row-matching algorithm, the size of the port state vector is rounded up to the nearest multiple of the number of bytes in the simulation host machine's word size, which, in a 32-bit machine implementation, is 4 bytes. Thus, the size of the port state vector may be rounded up to a multiple of 4 bytes for a 32-bit word size. For a 64-bit word size, the port state vector may be rounded up to a multiple of 8 bytes. This permits parallel bit-wise comparisons using native machine instructions that implement logical OR, logical AND, and testing for equivalence between two words of data. If the number of bytes, P, needed for state codes associated with the ports of the UDP is evenly divisible by 4, then no extra bytes are needed. If P is not evenly divisible by 4, then 1 to three extra bytes may be needed; the number of extra bytes would be (P modulo 4). The extra bytes are marked as block 302 and are filled with a pattern indicating X to indicate an unknown value. Other fill values may be used.

In an example implementation, the state codes in the port state vector are stored in contiguous bytes of memory. For example, for a machine architecture (1) having 32-bit data words, (2) having a randomly addressable memory of 8-bit memory bytes, and (3) requiring data word-sized memory accesses to be data word aligned for fastest performance, bytes 0-3 of the port state vector may be stored in 4 consecutive bytes at data word-aligned memory address m, and if the port state vector has additional state codes, those additional state codes may be similarly stored in one or more blocks of 4 bytes at addresses m+4, m+8, etc.

FIG. 4 shows the format of a row 400 of a row-matching table for a sequential UDP. The row-matching table includes match patterns that correspond to the state codes in the port state vector 300. Each match pattern occupies a one-byte slot in the row. The row-matching table has the output match pattern in byte 0 of the table, and match patterns for the n inputs in bytes 1 through n. For a combinational UDP, there would not be a match pattern for the output of the UDP, and the input match patterns would occupy bytes 0 through n−1.

Each row of the row-matching table may include extra bytes, if needed, that correspond to the extra bytes 302 in the port state vector 300. The extra bytes are shown as block 402 and the match pattern is set to match any value in the corresponding bytes 302 in the port state vector.

Each row of the row-matching table further includes an associated output value. The output value is the new value that is output by the UDP in response to the port state vector matching the associated row of match patterns. In an example implementation, the new output value occupies 1 byte, as shown by block 404. In order to align the row of match patterns and associated new output value on four-byte boundaries, three empty bytes 406 precede the byte for the new output value.

In an example implementation, the match patterns in each row of the row-matching table are stored in contiguous bytes of memory as explained above for the port state vector. The new output value associated with the match patterns in a row may also be stored contiguous to the bytes of the row of match patterns.

FIG. 5 shows the format of input and output states in the port state vector and the match patterns in the row-matching table. The particular encoding of the states and match patterns supports bit-by-bit pattern matching, which significantly improves performance in simulating UDPs.

Each state and match pattern is encoded in an 8-bit byte. In a state code, bits 0-2 encode a new value of the signal at a port, bit 3 encodes a level that indicates the presence of an edge on the signal at the port, and bits 4-6 encode the old value of the signal at the port. In a match pattern, bits 0-2 specify a pattern for matching a new value in a state code, bit 3 specifies a pattern for matching the level value in a state code, and bits 4-6 specify a pattern for matching the old value in a state code.

In a state code, only one bit of the old value may be set, and only one bit of the new value may be set. If bit 0 is logic 1, then the new port value is X; if bit 1 is logic 0, the new port value is logic 1; if bit 2 is logic 1, the new port value is logic 0. The old value portion is similarly organized. To indicate an edge, one bit in the old value code is set, one bit in the new value code is set, and the level bit is cleared. For example, a 0-to-1 edge would be represented by the pattern 0100 0010. To indicate a level value, i.e., the absence of an edge, the level bit is set and the old value code is irrelevant. For example, a level of X would be represented by the pattern 0000 1001, or any other pattern whose last four bits are 1001.

The new output value associated with a row of patterns in the row-matching table is encoded in the same manner as the state code in the port state vector. The new output value stores only single level values or 0, 1, X, or a special NO_CHANGE encoding that means that the new output value is the same as the current output value.

In a match pattern, multiple bits in each of the old value and new value portions may be set, as well as the level bit, according to the signal value desired to be matched. Each pattern may have multiple bits set in order to match to multiple values of state codes. Examples of match patterns that represent examples of UDP state table entries are shown in Table 3.

TABLE 3

| UDP state table entry | Encoded match pattern | Description |
|---|---|---|
| 1 | 0111 1010 | Matches a level 1 or any edge whose new value is 1 |
| b | 0111 1110 | Matches a level 0 or 1, or any edge whose new value is 0 or 1 |
| ? | 0111 1111 | Matches any level or edge |
| (01) | 0100 0010 | Matches only a 0-to-1 edge |
| (0?) | 0100 0111 | Matches any edge whose old value is 0 |
| (?1) | 0111 0010 | Matches any edge whose new value is 1 |
| (bx) | 0110 0001 | Matches 0-to-X and 1-to-X edges |
| (??) | 0111 0111 | Matches any edge (but not a level) |
| <match any value> | 0111 1111 | Match pattern used for filler bytes in the row-matching table, same encoding as for "?" |

Figure 6:
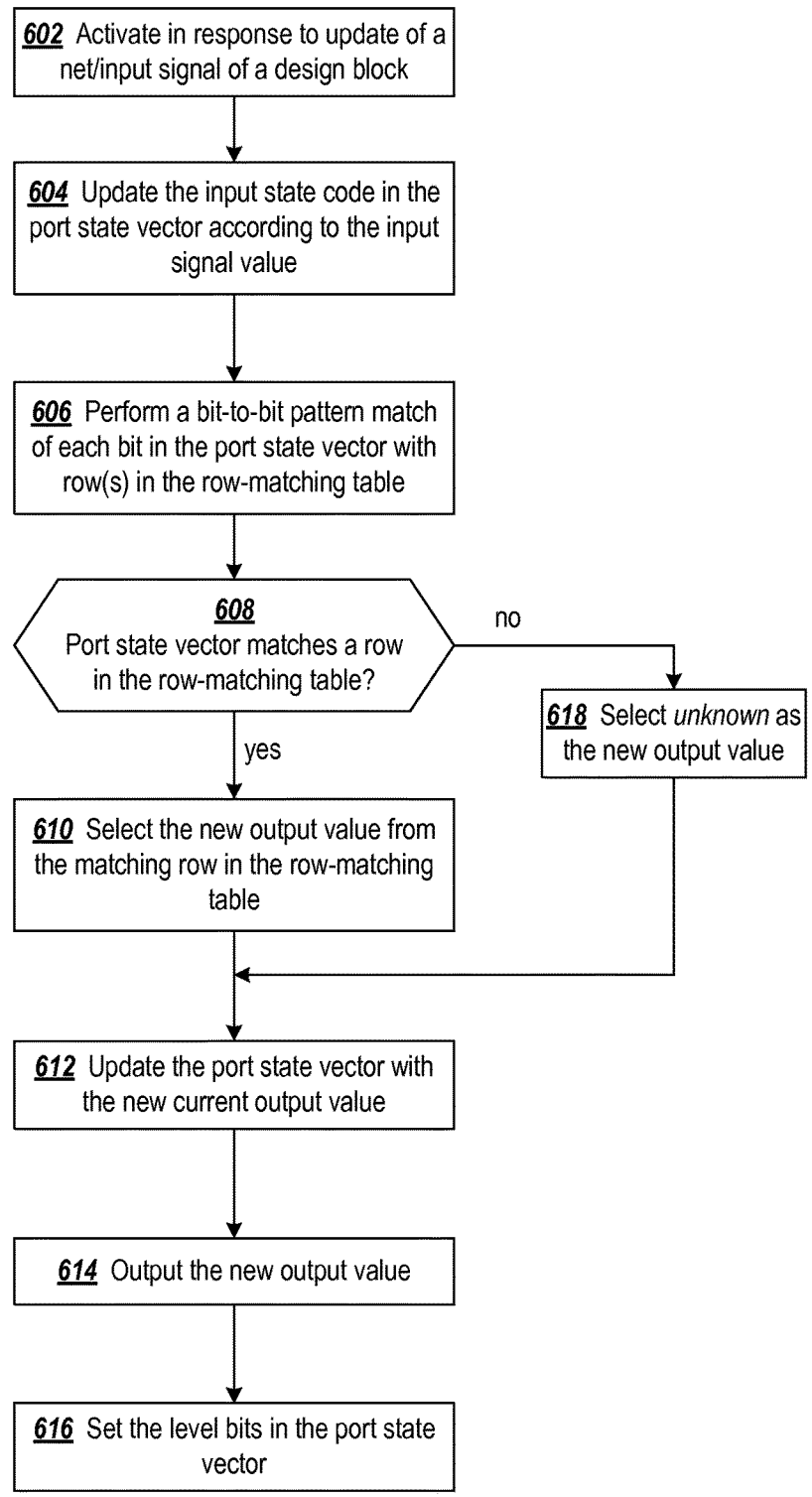
FIG. 6 shows a flowchart of a process of simulating a UDP block in a circuit design.

FIG. 6 shows a flowchart of a process of simulating a UDP block in a circuit design. At block 602, the process activates in response to an update of an input signal/net to the design block. In the port state vector, the input state code that corresponds to the input port at which the input signal was updated, is updated at block 604 with a code that represents the new value of the input signal. The transaction functions of a net, which would perform the processing of blocks 604 and 602 are further described below.

In general, in compiling a design for simulation and while constructing the transaction function for a net, the processes for which the net is a stimulus are examined. For each such process, based on the HDL code specification of that process, the type of net value change that is relevant as a reason to run the process is identified, and then code is generated to check for that type of change and if present, schedule the process. For example, the HDL code for a particular process (ExecuteFnA) can specify that the process is to run for only positive edge changes (such as 0 to 1) of a net. The net's transaction function would then check for such a positive edge and schedule the process if found, as shown in the pseudo-code below.

For UDP processes, the previous and new values of the net are encoded, and if the net value has changed, the encoded state is stored in a byte of the UDP's port state vector. For example, if a sequential UDP instance udpB, which has an execute function, ExecuteFnB, has net N as its second input port, the transaction function for the net would include logic to encode the net value and store the encoded value in byte 2 of udpB's port state vector, as shown in the pseudo-code of Example 1. Note that the code has been simplified from its actual implementation for clarity.

```
Transaction_for_Verilog_net_N(netProps, newValue, . . . )
{
  if (isPositiveEdge(netProps.value, newValue))
    eventQueue.schedule(ExecuteFnA);
  EncodedValue      ev=udpEncodeValue(netProps.value,
    newValue);
  if (isEdge(ev)) {
    udpB.portStateVector[2]=ev;
    eventQueue.schedule(ExecuteFnB);
  }
  netProps.value=newValue;
}
```

Example 1

At block 606, the process performs a bit-to-bit pattern match between the port state vector and one or more row(s) of the row-matching table. The process performs a pattern match between the port state vector and one row of the row-matching table at a time. Once a row matches, no further rows of the row-matching table need to be considered. Thus, if the first row matches, the pattern matching is only performed for one row of the table. Otherwise, the pattern matching is performed on multiple rows.

In response to the port state vector matching a row of the row-matching table at block 608, the output value associated with the matching row is selected at block 610. If the port state vector does not match any row in the row-matching table, unknown is selected as the new output value at block 618. The port state vector is then updated with the new current output value at block 612, and the new output value is provided on the output port of the UDP at block 614. The level bits in the port state vector are set at block 616.

In an example implementation, the row-matching algorithm that implements the processing of blocks 606-616 in FIG. 6 is a C-language function whose main purpose is to search a row-matching table for a row that matches the values of a port state vector and produce a value for the UDP's output port. The pseudo-code in Example 2 shows the details of the algorithm.

```
iki_vlog_udp_matching(udp_result, portStateVector, rowMatchingTable)
{
  out_buf = X;
  if (rowMatchingTable.isSequential)
    portStateVector [0] = encode(udp_result);
  for each row in rowMatchingTable {
    for j = 0 to row.size - 4 step by 4 {
      row_match = (row.ports[j to j+3] & portStateVector[j to
         j+3])
         == portStateVector[j to j+3];
      if (!row_match)
        break;
    }
    if (row match) {
      out_buf = row.output;
      break;
    }
  }
  if (out_buf == NO_CHANGE)
    out_buf = portStateVector[0];
  udp_result = decode(out_buf);
  if (rowMatchingTable.isSequential)
    for j = 0 to row.size - 4 step by 4
      portStateVector [j to j+3] |= 0x08080808;
}
```

Example 2

Upon entry to the algorithm, udp_result is set to the UDP instance's current output value, portStateVector is set to the port state vector of the UDP instance, and rowMatchingTable is set to the UDP design unit's row-matching table, which in addition to the matching rows themselves also includes other information about the UDP, such as whether it is a sequential or combinational UDP. The algorithm begins by assuming the output value will be X. Then, for sequential UDPs, the current output value of the UDP instance is taken from udp_result, encoded (in the format shown in FIG. 5), and the encoded value is stored in the current output slot (byte 0) of the port state vector.

Next, the algorithm performs pattern matching between the port state vector and one or more rows of the row-matching table until a match is found. In an example implementation, the algorithm iterates over the bytes of the row 4 bytes at a time, loading 4 match pattern bytes from the row into a machine word, and performing a simultaneous bit-wise AND with 4 bytes from the port state vector. If the result of the AND operation is the same as the 4 bytes from the port state vector, then those 4 bytes match. It will be appreciated that the pattern matching may be performed in parallel on systems in which there are multiple processors available. For example, different processors may be assigned to perform the pattern matching for a designated subset of the rows of the row-matching table. It will also be appreciated that the form of parallelism described in the example implementation of Example 2 can be extended on systems offering Single Instruction Multiple Data (SIMD) operations. For example, in place of 4 byte-wide processing units in the row-matching algorithm, larger processing units are possible using SIMD instructions for the bit-wise AND and equality operations.

If the current set of 4 bytes from both tables match, the algorithm proceeds to the next 4 bytes, and so on, until all UDP ports have been compared. If any set of 4 bytes fails to match, the remainder of the row is skipped and the algorithm proceeds to the next row. If all 4-byte groups of a row match, then the output is taken to be that value specified in the row, and the search for a matching row terminates.

Tables 4 and 5 show an example of a row match performed on an 8-input sequential UDP.

TABLE 4

|  | Current Output | Input 0 | Input 1 | Input 2 |
|---|---|---|---|---|
| Port state table | 1<br>0000 1010 | (01)<br>0100 0010 | 0<br>0000 1100 | (10)<br>0010 0100 |
| Current row | 1<br>0111 1010 | (0?)<br>0100 0111 | ?<br>0111 1111 | 0<br>0111 1100 |
| Result of AND | 0000 1010 | 0100 0010 | 0000 1100 | 0010 0100 |
| Conclusion |  | PASS |  |  |

TABLE 5

|  | Input 3 | Input 4 | Input 5 | Input 6 | Input 7 | — | — | — |
|---|---|---|---|---|---|---|---|---|
| Port state table | 1<br>0000 1010 | (01)<br>0100 0010 | 0<br>0000 1100 | 0<br>0000 1100 | 1<br>0000 1010 | | | |
| Current row | 0<br>0111 1100 | ?<br>0111 1111 | ?<br>0111 1111 | 0<br>0111 1100 | ?<br>0111 1111 | | | |
| Result of AND | 0000 1000 | 0100 0010 | 0000 1100 | 0000 1100 | 0000 1010 | | | |
| Conclusion |  | FAIL |  |  | SKIPPED | | | |

Table 4 shows that ANDing the bytes that encode the state codes for the current output, input 0, input 1, and input 2 of the port state vector with the corresponding match patterns in the current row of the row-matching table produces results that are equal to the state codes. Thus, the four state codes in Table 4 match the corresponding match patterns in the current row of the row-matching table. Table 5 shows that the state codes for input 3, input 4, input 5, and input 6 do not match the corresponding match patterns in the current row. For input 3, bit 1 of the result of the AND does not equal bit 1 of the port state code. Since the four-byte pattern match for input 3, input 4, input 5, and input 6 failed, the pattern match for input 7 can be skipped.

Once a matching row has been found or all rows of the row-matching table have been exhausted, out_buf will have been set to the intended output value. The algorithm then checks the output value for the special case of "-" in the UDP state table, which indicates that the new output value should be the same as the current output value. If that is the case, the output value is taken from byte 0 of the port state vector, as previously set to be the current output value. The new output value is next decoded back to a form suitable for simulation and returned as the algorithm's udp_result argument.

Finally, if the UDP is sequential, the algorithm iterates over all values in the port state vector, again 4 bytes at a time, setting the level bits of each value using a mask value, so that inputs no longer register as having edges, in preparation for the next delta cycle.

Figure 7:
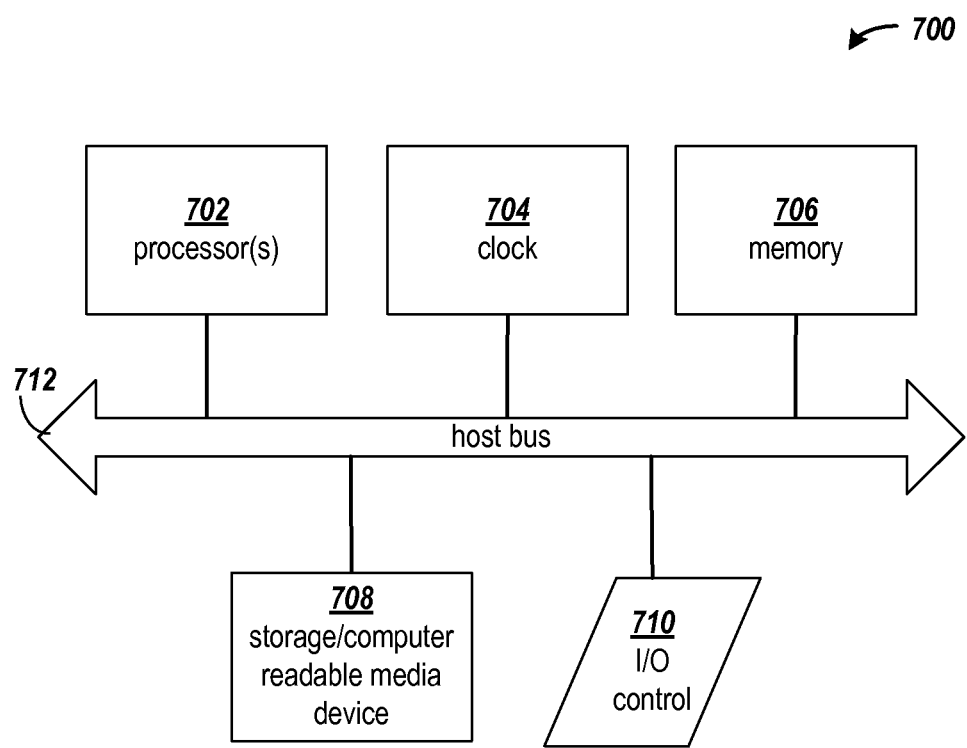
FIG. 7 shows a block diagram of an example computing arrangement that may be configured to implement the data structures and processes described herein.

FIG. 7 shows a block diagram of an example computing arrangement that may be configured to implement the data structures and processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 700 includes one or more processors 702, a clock signal generator 704, a memory arrangement 706, a storage arrangement 708, and an input/output control unit 710, all coupled to a host bus 712. The arrangement 700 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 702 may be one or more general purpose processors, or a combination of one or more general purpose processors and suitable co-processors, or one or more specialized processors (e.g., RISC, CISC, pipelined, etc.).

The memory arrangement 706 typically includes multiple levels of cache memory, and a main memory. The storage arrangement 708 may include local and/or remote persistent storage, such as provided by magnetic disks (not shown), flash, EPROM, or other non-volatile data storage. The storage unit may be read or read/write capable. Further, the memory arrangement 706 and storage arrangement 708 may be combined in a single arrangement.

The processor(s) 702 executes the software in storage arrangement 708 and/or memory arrangement 706, reads data from and stores data to the storage arrangement 708 and/or memory arrangement 706, and communicates with external devices through the input/output control unit 710. These functions are synchronized by the clock signal generator 704. The resource of the computing arrangement may be managed by either an operating system (not shown), or a hardware control unit (not shown).

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for simulating circuit designs. Other aspects and features will be apparent to those skilled in the art from consideration of the specification. The methods and system may be implemented as one or more processors configured to execute software, as an application specific integrated circuit (ASIC), or as a logic on a programmable logic device, for example. It is intended that the specification and drawings be considered as examples only, with a true scope of the invention being indicated by the following claims.

What is claimed is:

1. A method of simulating a user-defined primitive (UDP) of a circuit design, wherein the UDP is a design unit of the circuit design and has a plurality of input ports and an output port, and the UDP is specified as combinations of values of the plurality of input ports and respective values of the output port associated with the combinations of values of the plurality of input ports, the method comprising:

storing a row-matching table in a memory of a computing arrangement, the row-matching table including a plurality of rows, and each row including respective encoded input match patterns corresponding to the plurality of input ports of the UDP and an associated output value of the UDP;

storing in the memory a port state vector, the port state vector including a plurality of input state codes associated with the plurality of input ports of the UDP, respectively; and in response to an update of an input signal value at one of the plurality of input ports of the UDP during simulation on a programmed processor of the computing arrangement, performing operations including:

updating the input state code associated with the one of the plurality of input ports according to the updated input signal value;

performing a bit-to-bit pattern match of each bit in the port state vector to a corresponding bit in the encoded input match patterns in one or more rows of the row-matching table;

in response to each bit in the port state vector matching the corresponding bit of the encoded input match patterns in one of the rows of the row-matching table, selecting the associated output value of the one row as a new output value of the UDP; and outputting the new output value.

2. The method of claim 1, further comprising storing each input state code in one byte and storing each encoded input match pattern in one byte.

3. The method of claim 2, wherein the performing of the bit-to-bit pattern match includes:

performing a logical AND of each bit of each input state code with a corresponding bit of the corresponding encoded input match pattern, the logical AND producing an AND-result; and testing the AND-result for equivalence to the input state code.

4. The method of claim 1, wherein:

each input state code includes an encoded old input value of a respective input signal at the associated input port and an encoded new input value of the respective input signal at the associated input port;

the encoded old input value in each input state code is represented by three bits;

the encoded new input value in each input state code is represented by three bits; and in the three bits representing the encoded old input value and in the three bits representing the encoded new input value, a state of a first bit indicates a logic 0 value, a state of a second bit indicates a logic 1 value, and a state of a third bit indicates an unknown value.

5. The method of claim 4, wherein:

each encoded input match pattern includes three bits that represent an old input value pattern and three bits that represent a new input value pattern; and in the three bits representing the old input value pattern and in the three bits representing the new input value pattern, a state of a first bit is for matching a logic 0 value, a state of a second bit is for matching a logic 1 value, and a state of a third bit is for matching an unknown value.

6. The method of claim 1, wherein:

each row of the row-matching table further includes a respective encoded output match pattern;

the port state vector further includes an output state code;

the performing of the bit-to-bit pattern match includes performing a bit-to-bit pattern match of each bit of the output state code to a corresponding bit of the respective encoded output match pattern in the one or more rows of the row-matching table; and the selecting of the associated output value is in response to the encoded input match patterns and the encoded output match pattern in one of the rows of the row-matching table being equivalent to the port state vector.

7. The method of claim 6, wherein:

the output state code includes an encoded old output value and an encoded new output value;

the encoded old output value is represented by three bits;

the encoded new output value is represented by three bits;

the respective encoded output match pattern includes an old output value pattern represented by three bits and a new output value pattern represented by three bits;

in the three bits representing the encoded old output value and in the three bits representing the encoded new output value, a state of a first bit indicates a logic 0 value, a state of a second bit indicates a logic 1 value, and a state of a third bit indicates an unknown value; and in the three bits representing the old output value pattern and in the three bits representing the new output value pattern, a state of a first bit is for matching a logic 0 value, a state of a second bit is for matching a logic 1 value, and a state of a third bit is for matching an unknown value.

8. The method of claim 1, wherein:

each input state code includes a level indicator, an encoded old input value of a respective input signal at the associated input port, and an encoded new input value of the respective input signal at the associated input port;

the level indicator is represented by one bit;

the encoded old input value in each input state code is represented by three bits;

the encoded new input value in each input state code is represented by three bits;

in the three bits representing the encoded old input value and in the three bits representing the encoded new input value, a state of a first bit indicates a logic 0 value, a state of a second bit indicates a logic 1 value, and a state of a third bit indicates an unknown value; and the method further comprises setting the one bit that represents the level indicator in each input state code after the performing of the bit-to-bit pattern match.

9. The method of claim 8, wherein the setting of the one bit that represents the level indicator includes performing a logical OR between each input state code and a mask value having a bit that corresponds to the level indicator being set to logic 1.

10. The method of claim 1, wherein the performing of the bit-to-bit pattern match includes performing a bit-to-bit pattern match of each bit in the port state vector to a corresponding bit in the encoded input match patterns in one row of the row-matching table in parallel with performing a bit-to-bit pattern match of each bit in the port state vector to a corresponding bit in the encoded input match patterns in another row of the row-matching table.

11. A system for simulating a user-defined primitive (UDP) of a circuit design, wherein the UDP is a design unit of the circuit design and has a plurality of input ports and an output port, and the UDP is specified as combinations values of the plurality of input ports and respective values of the output port associated with the combinations of values of the plurality of input ports, the system comprising:

a processor; and a memory coupled to the processor and configured with instructions executable by the processor, wherein the instructions when executed by the processor cause the processor to perform operations including:

storing a row-matching table in a memory of a computing arrangement, the row-matching table including a plurality of rows, and each row including respective encoded input match patterns corresponding to the plurality of input ports of the UDP and an associated output value of the UDP;

storing in the memory a port state vector, the port state vector including a plurality of input state codes associated with the plurality of input ports of the UDP, respectively; and in response to an update of an input signal value at one of the plurality of input ports of the UDP during simulation:

updating the input state code associated with the one of the plurality of input ports according to the updated input signal value;

performing a bit-to-bit pattern match of each bit in the port state vector to a corresponding bit in the encoded input match patterns in one or more rows of the row-matching table;

in response to each bit in the port state vector matching the corresponding bit of the encoded input match patterns in one of the rows of the row-matching table, selecting the associated output value of the one row as a new output value of the UDP; and outputting the new output value.

12. The system of claim 11, the operations further including storing each input state code in one byte and storing each encoded input match pattern in one byte.

13. The system of claim 12, wherein the performing of the bit-to-bit pattern match includes:

performing a logical AND of each bit of each input state code with a corresponding bit of the corresponding encoded input match pattern, the logical AND producing an AND-result; and testing the AND-result for equivalence to the input state code.

14. The system of claim 11, wherein:
each input state code includes an encoded old input value of a respective input signal at the associated input port and an encoded new input value of the respective input signal at the associated input port;
the encoded old input value in each input state code is represented by three bits;
the encoded new input value in each input state code is represented by three bits; and
in the three bits representing the encoded old input value and in the three bits representing the encoded new input value, a state of a first bit indicates a logic 0 value, a state of a second bit indicates a logic 1 value, and a state of a third bit indicates an unknown value.

15. The system of claim 14, wherein:
each encoded input match pattern includes three bits that represent an old input value pattern and three bits that represent a new input value pattern; and
in the three bits representing the old input value pattern and in the three bits representing the new input value pattern, a state of a first bit is for matching a logic 0 value, a state of a second bit is for matching a logic 1 value, and a state of a third bit is for matching an unknown value.

16. The system of claim 11, wherein:
each row of the row-matching table further includes a respective encoded output match pattern;
the port state vector further includes an output state code;
the performing of the bit-to-bit pattern match includes performing a bit-to-bit pattern match of each bit of the output state code to a corresponding bit of the respective encoded output match pattern in the one or more rows of the row-matching table; and
the selecting of the associated output value is in response to the encoded input match patterns and the encoded output match pattern in one of the rows of the row-matching table being equivalent to the port state vector.

17. The system of claim 16, wherein:
the output state code includes an encoded old output value and an encoded new output value;
the encoded old output value is represented by three bits;
the encoded new output value is represented by three bits;
the respective encoded output match pattern includes an old output value pattern represented by three bits and a new output value pattern represented by three bits;
in the three bits representing the encoded old output value and in the three bits representing the encoded new output value, a state of a first bit indicates a logic 0 value, a state of a second bit indicates a logic 1 value, and a state of a third bit indicates an unknown value; and
in the three bits representing the old output value pattern and in the three bits representing the new output value pattern, a state of a first bit is for matching a logic 0 value, a state of a second bit is for matching a logic 1 value, and a state of a third bit is for matching an unknown value.

18. The system of claim 11, wherein:
each input state code includes a level indicator, an encoded old input value of a respective input signal at the associated input port, and an encoded new input value of the respective input signal at the associated input port;
the level indicator is represented by one bit;
the encoded old input value in each input state code is represented by three bits;
the encoded new input value in each input state code is represented by three bits;
in the three bits representing the encoded old input value and in the three bits representing the encoded new input value, a state of a first bit indicates a logic 0 value, a state of a second bit indicates a logic 1 value, and a state of a third bit indicates an unknown value; and
the operations further include setting the one bit that represents the level indicator in each input state code after the performing of the bit-to-bit pattern match.

19. The system of claim 18, wherein the setting of the one bit that represents the level indicator includes performing a logical OR between each input state code and a mask value having a bit that corresponds to the level indicator being set to logic 1.

20. The system of claim 11, wherein the performing of the bit-to-bit pattern match includes performing a bit-to-bit pattern match of each bit in the port state vector to a corresponding bit in the encoded input match patterns in one row of the row-matching table in parallel with performing a bit-to-bit pattern match of each bit in the port state vector to a corresponding bit in the encoded input match patterns in another row of the row-matching table.

* * * * *